(12) United States Patent
DeFelice et al.

(10) Patent No.: US 6,391,798 B1
(45) Date of Patent: *May 21, 2002

(54) PROCESS FOR PLANARIZATION A SEMICONDUCTOR SUBSTRATE

(75) Inventors: Richard Alden DeFelice, Bernardsville; Judith Prybyla, Edison, both of NJ (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 09/627,084

(22) Filed: Jul. 27, 2000

Related U.S. Application Data

(63) Continuation-in-part of application No. 09/024,488, filed on Feb. 17, 1998, now abandoned, which is a continuation-in-part of application No. 08/695,181, filed on Aug. 1, 1996, now Pat. No. 5,736,424, which is a continuation-in-part of application No. 08/245,279, filed on May 18, 1994, now abandoned, which is a continuation-in-part of application No. 07/593,362, filed on Oct. 1, 1990, which is a continuation of application No. 07/349,975, filed on May 8, 1989, now abandoned, which is a continuation of application No. 07/020,332, filed on Feb. 27, 1987, now abandoned.

(60) Provisional application No. 60/044,582, filed on Apr. 22, 1997.

(51) Int. Cl.$^7$ .................. H01L 21/302; H01L 21/461
(52) U.S. Cl. .................. 438/780; 438/481
(58) Field of Search .................. 438/693, 760, 438/781, 780, 778, 692, 691, 690

(56) References Cited

U.S. PATENT DOCUMENTS

| 4,874,463 A | 10/1989 | Koze et al. ............... 156/645 |
| 6,048,799 A | * 4/2000 | Prybyla |

* cited by examiner

*Primary Examiner*—George Fourson
*Assistant Examiner*—D. M. Collins
(74) *Attorney, Agent, or Firm*—Richard J. Botos

(57) ABSTRACT

A process for forming a semiconductor wafer with a flat surface is disclosed. In the process, a bare semiconductor wafer that has been sawed from an ingot is provided. A layer of planarization material is formed on at least one major surface of the semiconductor wafer. The layer of planarization material is placed into contact with a respective object having a flat surface. Pressure is applied to cause the planarization material to flow and impart a planar, surface to the layer of planarization material. The planarization material is then hardened. The flat surface is separated from contact with the respective layer of hardened material. The surface flatness is then transferred into the underlying substrate surface.

10 Claims, 1 Drawing Sheet

PROCESS FOR PLANARIZATION A SEMICONDUCTOR SUBSTRATE

STATEMENT OF RELATED APPLICATIONS

The application is a continuation in part of Blalock 1-5-3-29, Provisional Serial No. 60/044,582, filed Apr. 22, 1997, which is now Ser. No. 09/024,488, abandoned, which is a continuation-in-part of Ser. No. 08/695,181, now U.S. Pat. No. 5,736,424 filed Aug. 1, 1996 which is a continuation in part of Ser. No. 08/245,279, filed May 18, 1994, abandoned, which is a continuation-in-part of Ser. No. 07/593,362, filed Oct. 1, 1990, which is a continuation of Ser. No. 07/349,975, filed May 8, 1989, abandoned, which a continuation of Ser. No. 07/020,332, filed Feb. 27, 1987, abandoned.

BACKGROUND OF THE INVENTION

1. Technical Field

This invention is related to device processing and in particular to a process for planarizing the surface of a semiconductor substrate on which devices are subsequently formed.

2. Art Background

In semiconductor device fabrication, the devices (e.g. integrated circuits) are formed on semiconductor substrates that are typically referred to as wafers. The wafers themselves are formed by slicing a cylindrical ingot of semiconductor (e.g. silicon) material. The ingot is sliced with a saw. The resulting wafers sawed from the ingot have a rough surface.

Typically, the wafers sawed from the ingot are polished (referred to as lapping) to smooth the surface and provide the surface with a planar geometry that is suitable for subsequent device fabrication. In a conventional lapping process, a slurry of abrasive particles (e.g., $Al_2O_3$) is used to smooth the surface of the wafer. The lapped surface is then etched in an isotropic etchant (e.g. KOH) to remove surface damage and debris.

However, as noted in U.S. Pat. No. 4,874,463 to Koze et al., even after lapping and etching, pits or depressions remain in the wafer surface. Koze et al. proposes an alternative method for wafer polishing. In the Koze et al. method, an etch resistant coating is formed on the wafer surface. The etch resistant coating is removed from the high points on the horizontal surface of the wafer. An isotropic etching process is used to remove the wafer surface down to the depths of the pit. The isotropic etchant undercuts the protective coating. But, because only the high points of the wafer surface are exposed to the etchant initially, the high points are removed. After the isotropic etch, the remaining portions of the protective coating are removed. The wafer is then polished to remove any remaining protrusions. Koze et al. contemplate that both major surfaces may be polished in this manner.

Although processes such as the one described in Koze et al. provide wafer surfaces that are adequately smooth, such processes are complex and time-consuming. Accordingly, wafer smoothing processes that are comparatively simple and less time-consuming, yet provide suitable smooth wafer surfaces, are sought.

SUMMARY OF THE INVENTION

The present invention is a process for planarizing the major surfaces of a semiconductor substrate after the semiconductor substrate has been sawed from a semiconductor ingot. The initial topography of the substrate surface results from sawing the wafer from the ingot and any subsequent lapping. The process of the present invention uses an object with a flat surface to planarize a material of appropriate viscosity after it is formed on the substrate surface. That is, the planarization material is forced into planarity by contacting the planarization material with the object having a flat surface.

Objects with sufficiently flat surfaces for use in the present invention are well known to one skilled in the art. One example of such an object is an optical flat made of fused silica. The flat surface is configured to transfer the desired degree of planarity to the planarization material.

The planarization material should have a viscosity of about 20 centipoise to about 1000 centipoise, preferably about 60 centipoise to about 200 centipoise and most preferably about 100 centipoise, (after it is applied to the substrate surface and the solvent is evaporated). The viscosity is controlled by controlling the temperature (i.e. the higher the temperature, the lower the viscosity and vice-versa). However, the temperature of the wafer is maintained within conventional process limits. This viscosity is referred to herein as the preplanarization viscosity to distinguish it from the viscosity of the planarization material at other points in the process. The planarization material is solidified (i.e. hardened) while in contact with the flat surface by curing or by some other mechanism for solidifying the planarization material. The curing conditions depend upon the particular planarization material. Upon solidification e.g., curing, the volume of the planarization material is reduced by less than about 10%. The cured planarization material has a surface planarity such that the variations in height over any 3 cm by 3 cm area of the planarization material do not exceed about 300 nm. A surface planarity with height various (over a given 3 cm×3 cm area) of 100 nm or less is obtainable using the process of the present invention. In fact, the inventive process can provide a surface planarity with height variations of less than 50 nm if required.

After the planarization material is cured, or after its viscosity has been increased, the flat surface is separated from contact with the planarization material. It is advantageous if a release agent is on the flat surface prior to planarization in order to facilitate this separation without degrading the planarity of the planarization material. The composition of the release agent will depend upon the composition of the planarization material. For example, if the planarization material is an epoxy material, the release agent on the flat surface is a material that is inert with respect to the epoxy material. That is, there is substantially no adhesive force between the release agent and the epoxy material when the flat surface is separated from contact with the epoxy material.

The present invention contemplates that at least one substrate surface is planarized in the above-described manner. In an additional embodiment both major surfaces are planarized simultaneously. In this embodiment, it is advantageous if the major surfaces are lapped after sawing but before planarization. The lapping step provides two major surfaces that are approximately parallel.

Both major surfaces are planarized simultaneously by using two objects with sufficiently flat surfaces. The process of simultaneous planarization is illustrated schematically in FIGS. 1 and 2. The substrate 10 with the layer of planarization material 15 formed on both major surfaces 11 is placed between the two objects 20. Referring to FIG. 2, the two objects 20 are then placed in contact with the substrate 10 having the planarization material 15 formed on both major surfaces 11.

Once the planarization material is planarized and hardened, the planar surface is then transferred into the major surface of the substrate. In the embodiment of the present invention where both surfaces are planarized, this step is done separately for each surface. The planar surface is transferred into the underlying substrate using known processing techniques such as plasma reactive ion etching. It is advantageous if the planarization material has an etching resistance that is about the same as the etch resistance of the underlying semiconductor substrate. Suitable etching conditions to effect the desired transfer will depend upon the particular materials that are to be etched. Such etching conditions are known to those skilled in the art. Typically, the semiconductor substrate is a silicon wafer or a wafer made of a III-V material (e.g. silicon germanium) wafer.

DETAILED DESCRIPTION

Figure 1:
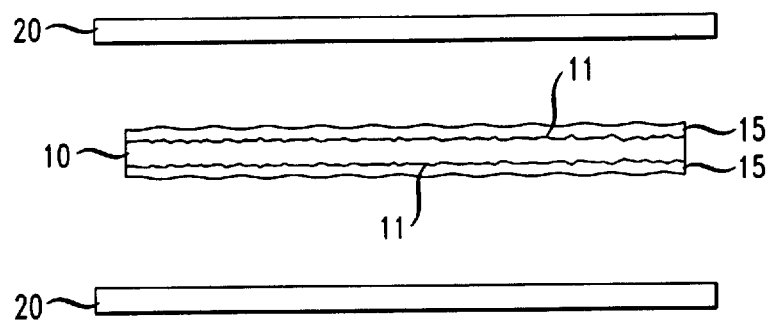
FIG. 1 is a side view of the wafer with two layers of planarization material thereon before contact with the objects having a flat surface.
Figure 2:
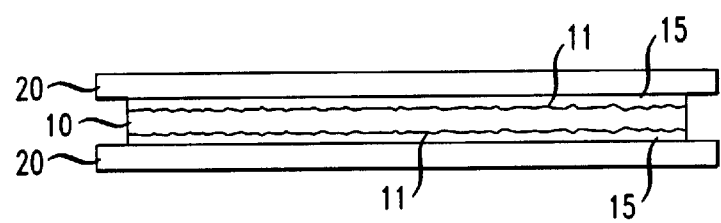
FIG. 2 is a side view of the wafer with the two layers of planarization material thereon after contact with the objects having a flat surface.

In the present process, a planarization material is formed on a major surface and forced into planarity using an object with a flat surface. The flat surface has a flatness which is adequate to planarize the material to an acceptable degree of planarity. In processes for device fabrication, an acceptable degree of planarity depends on device requirements, including device dimensions. Typically, the topography is not more than about 300 nm over any 3 cm by 3 cm area in the surface of the planarization material. Topography, as used herein, encompasses all deviations from a theoretical, perfectly flat surface. It is advantageous if such variations in the topography do not exceed about 100 nm over any 3 cm by 3 cm area of the planarization material. The present invention is capable of providing a surface planarity in which variations do not exceed 50 nm over the specified area. The object with the flat surface contacts the planarization material with sufficient force to transfer the flatness from the flat surface to the planarization material.

To obtain the desired results in a process having a planarization step, the surface to be planarized is treated with a freely flowing planarization material, i.e., a material that has a viscosity of about 20 cp to about 1000 cp, preferably about 60 cp to about 200 cp, and most preferably about 100 cp. The planarization material has the specified viscosity after the planarization material is applied to the substrate surface and the solvent has evaporated therefrom. This material should be capable of being solidified after it is planarized. The requisite degree of solidification occurs when the material is suited for subsequent processing. For example, if the planarization material is used in an etchback process, the planarization material must be sufficiently solidified so that it will retain its planarity. The etch conditions are selected so that the etching rate of the planarization material will be about the same as that of the underlying material. If the planarization material is used in a lithographic process, the material must be solidified to the point that it is rigid and impermeable. One skilled in the art will be able to determine to what degree the planarization material should be solidified in a particular application.

Examples of suitable materials include monomers, monomer mixtures, oligomers, and oligomer mixtures that are solidified through curing. Other examples of suitable materials include solid materials such as polymer melts that are softened by heating, planarized and then resolidified through cooling. These materials are herein referred to as planarization materials. It is advantageous if the hardened planarization material has a glass transition temperature, $T_g$, of at least about 90° C. It is particularly advantageous if the hardened planarization material has a glass transition temperature (Tg) of at least about 120° C., and preferably at least about 150° C. It is advantageous if the cured polymer or solid polymer melt is etched at the same rate as the material underlying the planarization material.

Planarization materials that are solidified by curing are typically cured by combining the planarization material with an acid generator that generates acid when heated or irradiated. The acid catalyzes polymerizations. These acid generators are well known to those skilled in the art. The specific acid generator used depends upon the planarization material and the desired curing conditions.

Epoxy resins are examples of planarization materials that are suited for use in the present process. One example of a suitable epoxy resin is epoxy novalac 431 (DEN-431) which is commercially obtained from the Dow Chemical Co. The uncured DEN-431 resin has a viscosity of about 100 cp at a temperature of 100° C. The resin is cured at a temperature of about 50° C. to about 100° C., in the presence of an acid catalyst. An example of a suitable acid catalyst is the photoacid generator triphenyl-sulphonium hexafluorophosphate. Another example of a suitable epoxy resin is DER-354, also commercially available from the Dow Chemical Co. The uncured DER-354 resin has a viscosity of about 100 cp (or less) at room temperature. Yet another example of a suitable planarization material suitable for use in the present process is spin-on-glass (SOG). Spin-on-glass materials are well known to one skilled in the art, and not discussed in detail herein.

Suitable planarization materials therefore have a viscosity (either before the solvent is added or after solvent evaporation) that permits it to flow when placed in contact with the flat surface. Also, the planarization material should shrink less than 10% by volume when solidified. Planarization materials that have more than 10% by volume of solvent after being planarized are not compatible with the present process. If the planarization material has more than 10 percent volume solvent after planarization but before solidification, the loss of solvent during solidification will adversely affect the planarity of the material.

The thickness of the planarization layer after solidification should be greater than or equal to about one and one-half times the height of the surface irregularities. Thicknesses much greater than this are not desirable because of excessive post processing time (e.g. etching), and thicknesses much less than this are not desirable because inadequate planarization results if material is not deposited above the highest topographic regions.

The required degree of planarity will vary depending upon the requirements of a particular process. The degree of topographic variations that are permissible on the surface of the planarization material depends on the device requirements. As previously noted the present invention can provide a surface planarity such that topographic variations do not exceed 300 nm, 100 nm or 50 nm (over a given 3 cm by 3 cm area) depending on the requirements for a particular application.

In addition to appropriate viscosity and solidification properties, the material utilized for planarization is a material that will not contaminate the wafer. Also, if the planarization material is to be utilized in an etch-back scheme, the etch rate of the material is matched to the etch rate of the underlying substrate. For example, under certain etch conditions, the rate at which the planarization material is removed should be in a range that is within about five percent of the rate at which the underlying substrate is etched. One skilled in the art is familiar with how closely these etching rates are matched to achieve acceptable processing results. Typically, the etch chemistry will have to be adjusted in order to match the etch rate of the planarization material with the etch rate of the underlying substrate.

In an alternative scheme, the planarization material is the top layer of a multilayer stack. For example, a layer of silicon dioxide ($SiO_2$) is sandwiched between the substrate and the planarization material. The planarized surface of the planarization material is then etch-transferred into the surface of the $SiO_2$ layer. The planarized surface of the $SiO_2$ layer is then etch-transferred into the wafer surface. This scheme can be used when it is difficult to match the etch rate of the planarization material with the etch rate of the wafer surface or when matching the etch rate requires the use of an etchant that provides an undesirably slow etch. In this embodiment, it is advantageous if the etch rate of the middle layer is matched to both the planarization material and the underlying substrate. This embodiment contemplates changing the etch chemistry during the etch of the middle material. Examples of suitable materials for the middle layer include $SiO_2$ (deposited from tetraethyl orthosilicate by plasma enhanced chemical vapor deposition (PECVD) or as spin-on-glass).

In another embodiment, the planarization material is spin-on-glass (SOG). In this embodiment, the SOG is spin-coated onto the substrate. The SOG is then planarized as described above using an object with a flat surface. The planarized, SOG is then solidified using heat. The object with the flat surface is then separated from the SOG. The SOG, if not completely cured during the solidification step, is then completely cured. The resulting planarized SOG layer is then etch rate matched to the underlying substrate in order to transfer the planarity of the SOG surface to the underlying substrate surface.

Additionally, it is desirable that the solidified planarization material have a $T_g$ higher than temperatures that are to be employed in subsequent processing steps. If the $T_g$ is lower, an undesirable change in surface configuration generally occurs upon subjecting the solidified planarization layer to those temperatures.

After the planarization material is applied onto the substrate, but before the planarization material is cured, the planarization material is contacted with the object with a flat surface to transfer the flatness of the surface to the planarization material.

Figure 3:
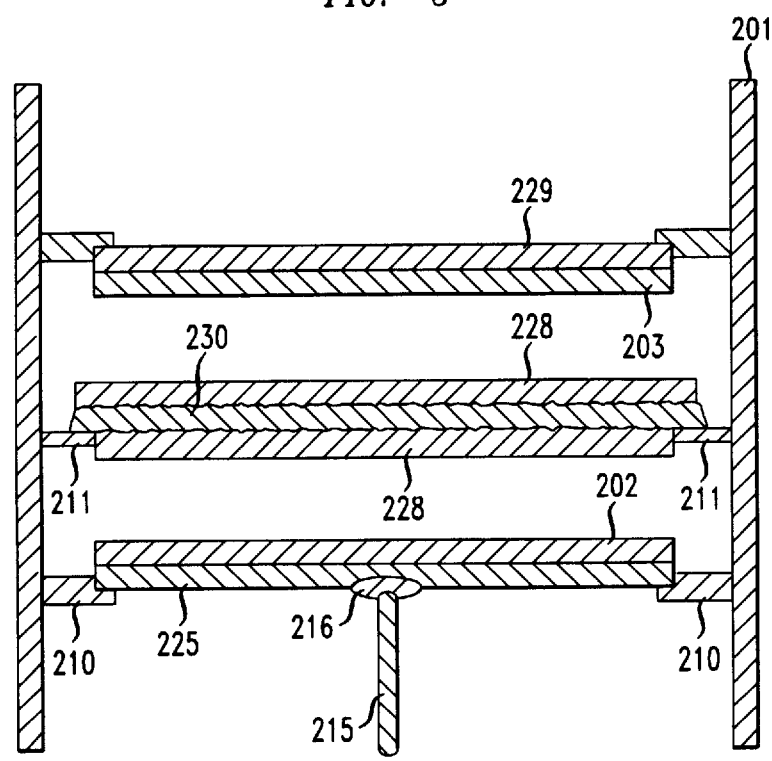
FIG. 3 is a schematic cross-section of a tool suitable for planarizing the planarization material on both sides of the wafer simultaneously.

A schematic illustration of a planarization tool 200 useful for planarizing the two layers of material formed over the surfaces of a topographic substrate is shown in FIG. 3. The component parts of planarization tool 200 include housing 201, within which is moveably affixed object 202 and rigidly affixed object 203. Each object 202 and 203 has a flat surface. The topographic substrate 230, containing a region of planarization material 228, is placed on a holding mechanism 211. Holding mechanism 211 is retractable. In the embodiment depicted in FIG. 3, the bottom object 202 is moveable from a first spatial position to a second spatial position. Guides 210 are provided to keep object 202 centered as it moves. When in the second spatial position, the planarization material 228 on the topographic substrate 230 is in contact with the flat surface of object 202, with sufficient force to raise the substrate 230 and place planarization material layer 228 into contact with the top object 203. Then sufficient force is applied to transfer the surface flatness from the flat surface of each object to the surface of the planarization material 228. In FIG. 3, planarization material layer 228 is depicted in its planarized state after curing, and after layers 228 are no longer in contact with objects 202 and 203.

Also in FIG. 3, gimbaled post 215 is provided to raise the bottom object 202 into contact with the planarization material 228 and the top layer of planarization material 228 into contact with object 203. Gimbaled post 215 facilitates level engagement between the objects 202 and 203 and the planarization material 228. This is because socket joint 216 allows object 202 to pivot with respect to post 215. Thus, when objects 202 and 203 contact planarization material 228, the post 215 will allow automatic paralleling between the plane of each object relative to the plane of the planarization material. This permits true level contact between the planarization material 228 and objects 202 and 203.

The object 202 is depicted as having a back surface 225. The back surface is provided to facilitate mechanical engagement to guides 210 and post 215. The object 202 is affixed to the back surface 225.

In the embodiments where planarization material 228 is hardened by a radiation cure, objects 202 and 203 are transparent to such radiation. In this embodiment, back surface 225 and 229 are metal rings (not shown). The metal rings permit the transmission of the curing radiation to the planarization material 228. When the bottom back support 225 is a ring, the gimbal mount is a hollow bellows cylinder (not shown). The bellows cylinder is affixed to the metal ring that supports the bottom object 202. Configuring the gimbal mount as a bellows cylinder enables the radiation to be transmitt ed through object 202 and to cure planarization material layer 228. The bellows cylinder is one example of a gimbal mount that permits the planarization material to be radiation cured.

In an alternate embodiment (not shown) the coated substrate is placed on one object (e.g. the bottom object). This object is then moved until the planarization material contacts the top object. The contact is such that the planarization material is planarized by the objects.

In yet a further embodiment, a wafer with a layer of planarization material on one major surface is placed in the apparatus and the planarization material layer is planarized. The wafer is then flipped over and spin-coated with a layer of planarization material on the second major surface. The planarization material layer on the second major surface is then planarized. In this embodiment, it is advantageous to use a thin (e.g. about 2 mm to about 5 mm thick) sheet of silicone rubber to protect the uncoated wafer surface during the planarization of the first major surface.

Objects having flat surfaces sufficient for use in planarization tool 200 are well known to those skilled in the art. It is advantageous if the flat surface of object 202 transfers a degree of planarity such that the topographic variations in the surface of the planarization material 228 do not exceed the previously described parameters (less than about 300 nm to less than about 50 nm in a given 3 cm by 3 cm area, depending upon the device requirements). Also, it is advantageous for the object to be transparent to ultraviolet radiation, since many planarization materials are typically hardened (solidified) through exposure to such radiation.

One example of an object which transfers a sufficiently flat surface to the layer of planarization material when the object and the planarization material are contacted is an optical flat made of fused silica available from General Optics, Moorpark, Calif. The shape of object 202 is variable as are its dimensions, however, a sufficient thickness to transfer a flat surface with the desired degree of planarity to planarization material 228, is required. For example, a highly polished optical flat of fused silica having a diameter of about 9 inches and a thickness of about 1.5 inches is useful for transferring a flat surface having the desired degree of planarity.

When the planarization material is contacted by the object(s) having a flat surface, the force exerted by the objects against the planarization material causes such material to flow over the topographic surface of the substrate, thus flattening the surface of the planarization layer and improving the degree of planarity. The time necessary to planarize the planarization material formed on the topographic surface varies and is dependent upon the amount of force used to contact the planarization material to the flat surface of the object, the viscosity of the planarization material, and the thickness of the planarization material.

To obtain the desired results using planarization tool 200, the topographic substrate surface to be planarized is treated with a planarization material 228 having a viscosity within the range of 20 cp (centipoise) to 1000 cp (after the solvent is evaporated but prior to planarization). Additionally, planarization material 228 should be capable of solidification (hardened) after it is planarized. For example, if the planarization material is to be used in an etch-back process, the material must be hardened to the point that it is rigid and impermeable. One skilled in the art will be able to determine to what extent the planarization material should be solidified for a particular application. For many applications, the planarization material 228 is solidified by exposing the material to ultraviolet radiation.

Also, it is advantageous if the object with the flat surface is coated with a release agent, or an expedient is utilized to prevent the planarization material from sticking to the object. If the planarization material adheres to the object, the planarization of the material could be adversely affected when the object is separated from the planarization material. For example the desired release is obtained by dipping the object into a solution of n-octane containing three percent octadecyl trichlorosilane. A teflon sheet is an alternate release expedient. The teflon sheet is interposed between the planarization material and the object with the flat surface. The planarization material does not stick to the teflon sheet. The teflon sheet is sufficiently thin and is itself planar. Therefore, the teflon sheet permits the object's flat surface to be transferred into the planarization material.

The present invention is described in terms of specific embodiments. These embodiments are provided to illustrate the invention. One of ordinary skill in the art will appreciate that various modifications can be made to the disclosed embodiments that are within the scope of the claims below.

What is claimed is:

1. A process for planarizing a semiconductor wafer surface comprising:

providing a semiconductor wafer from a semiconductor ingot, wherein the provided semiconductor wafer has two major surfaces;

forming a layer of planarization material over at least one major surface, wherein the planarization material has a pre-planarization viscosity of about 20 cp to about 1000 cp;

contacting the planarization material with a flat surface of an object with a force sufficient to substantially transfer the surface flatness from the flat surface to the planarization material;

solidifying the material while in contact with the flat surface wherein the material undergoes a reduction in volume that is less than about 10 percent;

separating the flat surface from contact with the material; and transferring the flat surface into the underlying semiconductor wafer.

2. The process of claim 1 wherein the flat surface is coated with a release agent.

3. The process of claim 1 wherein the flat surface is an optically flat surface.

4. The process of claim 2 wherein the release agent is a teflon sheet.

5. The process of claim 1 wherein the layer of planarization material is formed on both major surfaces.

6. The process of claim 5 wherein the flat surface is an optically flat surface.

7. The process of claim 6 wherein the object is a fused silica optical flat.

8. The process of claim 1 wherein the planarization material is selected from the group consisting of epoxy resins and spin-on-glass.

9. The process of claim 1 wherein the flat surface is transferred into the underlying semiconductor wafer by plasma etching the planarization material.

10. The process of claim 1 further comprising forming an intermediate layer on the semiconductor wafer before the layer of planarization material is formed thereon and wherein the flat surface is transferred from the planarization material into the intermediate layer and from the intermediate layer into the underlying semiconductor wafer.

* * * * *